(12) United States Patent
Sahu et al.

(10) Patent No.: US 11,777,507 B2
(45) Date of Patent: *Oct. 3, 2023

(54) PHASE-LOCKED LOOP (PLL) WITH DIRECT FEEDFORWARD CIRCUIT

(71) Applicant: TEXAS INSTRUMENTS INCORPORATED, Dallas, TX (US)

(72) Inventors: Debapriya Sahu, Bengaluru (IN); Rittu Sachdev, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/865,808

(22) Filed: Jul. 15, 2022

(65) Prior Publication Data

US 2022/0360269 A1 Nov. 10, 2022

Related U.S. Application Data

(63) Continuation of application No. 17/146,510, filed on Jan. 12, 2021, now Pat. No. 11,418,201, which is a continuation of application No. 16/219,067, filed on Dec. 13, 2018, now Pat. No. 10,924,123.

(51) Int. Cl.
*H03L 7/093* (2006.01)
*H03L 7/083* (2006.01)
*H03L 7/095* (2006.01)

(52) U.S. Cl.
CPC .............. *H03L 7/093* (2013.01); *H03L 7/083* (2013.01); *H03L 7/095* (2013.01)

(58) Field of Classification Search
CPC .......... H03L 7/093; H03L 7/083; H03L 7/095
See application file for complete search history.

(56) References Cited

U.S. PATENT DOCUMENTS

| | | |
|---|---|---|
| 4,305,045 A | 12/1981 | Metz et al. |
| 5,663,685 A | 9/1997 | Kesner |
| 6,529,084 B1 | 3/2003 | Boerstler et al. |
| 7,345,550 B2 | 3/2008 | Bellaouar |
| 10,924,123 B2 | 2/2021 | Sahu |
| 11,418,201 B2 * | 8/2022 | Sahu ....................... H03L 7/089 |

(Continued)

OTHER PUBLICATIONS

Texas Instruments. "TS3USBCA4 USB Type-C SBU Multiplexer with MIC/AGND." SLLSF73—Feb. 2018.

(Continued)

*Primary Examiner* — Metasebia T Retebo
(74) *Attorney, Agent, or Firm* — Mandy Barsilai Fernandez; Frank D. Cimino

(57) ABSTRACT

A phase-locked loop (PLL) device includes: 1) a detector configured to output an error signal to indicate a phase offset between a feedback clock signal and a reference clock signal; 2) a charge pump coupled to the detector and configured to output a charge pump signal based on the error signal; 3) an integrator with a feedback path, an input node, a reference node, and an output node, wherein the input node is coupled to the charge pump and receives the charge pump signal; 4) a voltage-controlled oscillator (VCO) coupled to the output node of the integrator via a resistor; and 5) a feedforward circuit coupled directly to the detector and configured to apply an averaged version of the error signal to correct a voltage level received by the VCO.

20 Claims, 5 Drawing Sheets

(56) References Cited

U.S. PATENT DOCUMENTS

| | | |
|---|---|---|
| 2002/0033714 A1 | 3/2002 | Perrott |
| 2005/0195002 A1 | 9/2005 | Puccio |
| 2009/0015338 A1 | 1/2009 | Frey |
| 2009/0237131 A1 | 9/2009 | Shin |
| 2013/0154697 A1 | 6/2013 | Katsushima |
| 2013/0316661 A1 | 11/2013 | Lee et al. |
| 2015/0084678 A1 | 3/2015 | Fukuda |
| 2017/0331483 A1 | 11/2017 | Hossain et al. |

OTHER PUBLICATIONS

Notification of Transmittal of the International Search Report and the Written Opinion of the International Searching Authority, or the Declaration; PCT/US 2019/065611; dated Mar. 5, 2020; 6 pages.
Extended European Search Report; Application No./Patent No. 19895675.7-1203/3895319 PCT/US2019065611; dated Mar. 1, 2022, 8 pages.

* cited by examiner

PHASE-LOCKED LOOP (PLL) WITH DIRECT FEEDFORWARD CIRCUIT

CROSS-REFERENCE TO RELATED APPLICATIONS

This application is a continuation of U.S. patent application Ser. No. 17/146,510, filed Jan. 12, 2021, which is a continuation of U.S. patent application Ser. No. 16/219,067, filed Dec. 13, 2018 (now U.S. Pat. No. 10,924,123), all of which are hereby incorporated herein by reference in their entirety.

BACKGROUND

Phase-locked loops (PLLs) are control circuits used to provide an output signal based on the phase difference between two input signals. An example PLL topology includes a phase detector, a charge pump, a loop filter, and a voltage-controlled oscillator (VCO). Example uses of PLLs include signal demodulation, signal recovery from a noisy communication channel, frequency synthesis based on an input frequency, and distribution of precisely timed clock pulses. Example systems that use PLLs include radios systems, telecommunication systems, and/or computer systems.

PLLs are imperfect control circuits, where inaccuracies in the form of phase noise are an ongoing issue. The phase noise occurs due to imperfections in PLL components such as the voltage-controlled oscillator, charge pump and/or loop filter. The push to miniaturize PLLs has been found to increase phase noise. Efforts to improve PLL design and performance are ongoing.

SUMMARY

In accordance with at least one example of the disclosure, a phase-locked loop (PLL) device comprises a detector configured to output an error signal to indicate a phase offset between a feedback clock signal and a reference clock signal. The PLL device also comprises a charge pump coupled to the detector and configured to output a charge pump signal based on the error signal. The PLL device also comprises an integrator with a feedback path, an input node, a reference node, and an output node, wherein the input node is coupled to the charge pump and receives the charge pump signal. The PLL device also comprises a voltage-controlled oscillator (VCO) coupled to the output node of the integrator via a resistor. The PLL device also comprises a feedforward circuit coupled directly to the detector and configured to apply an averaged version of the error signal to correct a voltage level received by the VCO.

In accordance with at least one example of the disclosure, an apparatus comprises circuitry configured to operate based on a clock signal. The apparatus also comprises a PLL configured to adjust the clock signal based on a reference clock signal. The PLL comprises a detector configured to output an error signal to indicate a phase offset between a feedback clock signal and a reference clock signal. The PLL also comprises a charge pump coupled to the detector and configured to output a charge pump signal based on the error signal. The PLL also comprises an integrator with a feedback path, an input node, a reference node, and an output node, wherein the input node is coupled to the charge pump and receives the charge pump signal. The PLL also comprises a VCO coupled to the output node of the integrator via a resistor, wherein the VCO is configured to adjust a phase of the clock signal based on the output of the integrator. The PLL also comprises a feedforward circuit coupled directly to the detector and configured to apply an averaged version of the error signal to correct a voltage level received by the VCO.

In accordance with at least one example of the disclosure, a PLL method comprises detecting, by a detector, an error signal to indicate a phase offset between a feedback clock signal and a reference clock signal. The method also comprises adjusting a charge pump output based on the error signal. The method also comprises integrating, by an integrator, the charge pump output as a function of time. The method also comprises converting the integrated charge pump output to a voltage signal. The method also comprises applying a correction to the voltage signal using a feedforward circuit coupled directly to the detector. The method also comprises using the corrected voltage signal, by a voltage-controlled oscillator, to provide an output signal with a phase based on the corrected voltage signal.

BRIEF DESCRIPTION OF THE DRAWINGS

For a detailed description of various examples, reference will now be made to the accompanying drawings in which.

DETAILED DESCRIPTION

Disclosed herein are phase-locked loop (PLL) circuits, devices, and methods involving a direct feedforward circuit to reduce phase noise. As used herein, a "direct feedforward circuit" refers to a feedforward circuit that is connected to the phase detector of a PLL circuit. In an example PLL circuit, the phase detector compares an input signal phase with a reference signal phase and provides an error signal (e.g., an UP or DOWN signal). An example UP signal indicates that the input signal phase needs to be increased towards the reference signal phase. An example DOWN signal indicates that the input signal phase needs to be decreased towards the reference signal phase. The feedforward circuit receives the error signal from the phase detector and adjusts a voltage fed into a voltage-controlled oscillator (VCO) that provides the output signal for the PLL circuit. In some examples, the feedforward circuit provides a feedforward signal to a loop filter of a PLL circuit. More specifically, the feedforward signal is used to adjust a reference signal for the loop filter such that an output of the loop filter is adjusted, resulting in an adjustment to the voltage fed into the VCO. In other examples, the feedforward circuit provides a feedforward signal to an input node of the VCO to adjust the voltage fed into the VCO. In either case, the feedforward signal provides a correction to the PLL circuit output that reduces phase noise.

In some examples, the feedforward circuit includes two branches, including first and second branches. The first branch is coupled to a first output node (e.g., an UP signal node) of the phase detector, and the second branch is coupled to a second output node (e.g., a DOWN signal node). As an example, the first branch includes an inverter and a first resistor, while the second branch includes a buffer and a second resistor. The first and second branches are joined at an output node of the feedforward circuit, resulting in the feedforward circuit providing an averaged value of the inputs at its output node.

With the correction provided by the feedforward circuit, the phase error at the PLL circuit output is reduced compared to other PLL circuit topologies. In addition, the disclosed PLL circuit topologies support miniaturization due at least some of the components being small relative to other PLL circuit topologies. In some examples, the disclosed PLL circuit topologies are used with WiFi radio devices and/or other scenarios, where low noise performance of the PLL is needed. To provide a better understanding, various PLL circuit options, feedforward circuit options, and related PLL method options are described using the figures as follows.

Figure 1:
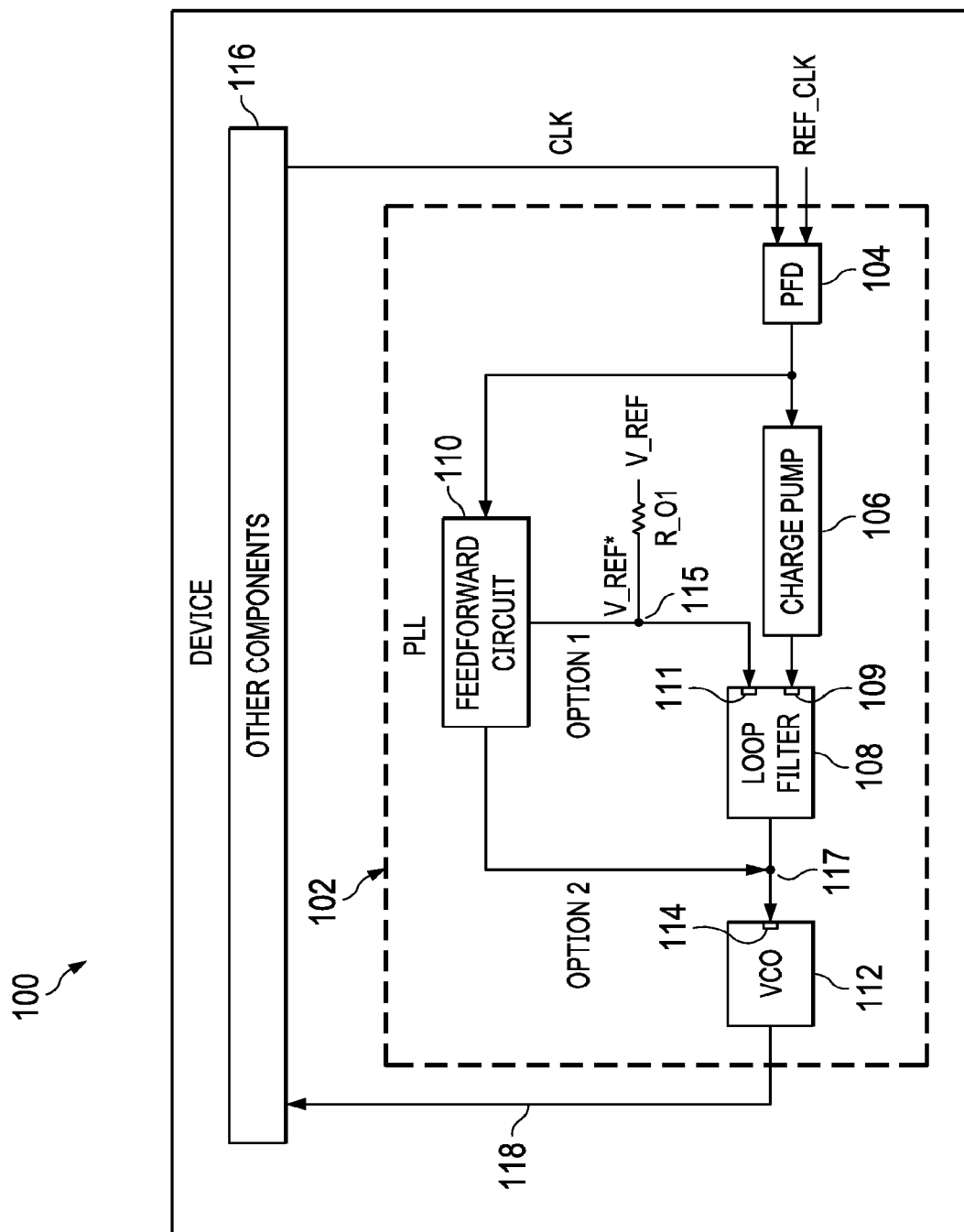
FIG. 1 is a block diagram illustrating an electronic device in accordance with various examples.

FIG. 1 is a block diagram illustrating an electronic device 100 in accordance with various examples. In FIG. 1, the electronic device 100 represents an integrated circuit (IC), a multi-die module, a printed circuit board (PCB), a consumer product (e.g., a radio device, a telecommunications device, or a computer device), and/or other devices. As shown, the electronic device 100 includes a PLL circuit 102 coupled to other components 116. In different examples, the other components 116 vary. In one example, the other components 116 include signal demodulation components. In another example, the other components 116 include signal recovery components. In another example, the other components 116 include frequency synthesis components. In another example, the other components 116 include clock distribution components. In different examples, the electronic device 100 is sold as a unit for use in a radio system, telecommunications systems, and/or computer system.

As shown in FIG. 1, the PLL circuit 102 includes a phase or frequency detector (PFD) 104 that receives a feedback signal (CLK) from the other components 116. The PFD 104 also receives a reference clock signal (REF_CLK). The output of the PFD 104 is an error signal between the phase of the CLK signal and the phase of the REF_CLK signal. As previously discussed, example outputs from the PFD 104 include UP or DOWN signals indicating how the CLK signal should be adjusted to align with the CLK REF signal (UP refers to increasing the phase for the CLK signal and DOWN refers to decreasing a phase for the CLK signal). The output from the PFD 104 is provided to a charge pump 106 and to a feedforward circuit 110. The output of the charge pump 106 is provided to a first input node 109 of the loop filter 108.

In one example (labeled option 1), the feedforward circuit 110 provides a feedforward signal to a second input node 111 of the loop filter 108. With option 1, the feedforward signal is combined with a reference signal (V_REF*) at feedforward node 115, where V_REF* is obtained by applying a reference signal (V_REF) to a resistor (R_O1). More specifically, the output of the loop filter 108 is a function of the combination of the V_REF* signal with the feedforward signal applied to the second input node 111, where the output of the loop filter 108 is used to provide a voltage to an input node 114 of the VCO 112. The output of VCO 112 is a signal with a phase based on the voltage at the input node 114 of the VCO 112.

In another example (labeled option 2), the feedforward circuit 110 provides a feedforward signal to a feedforward node 117 coupled to the input node 114 of the VCO 112. With option 2, the output of the loop filter 108 is combined with the feedforward signal at feedforward node 117 and the combined signal is provided to the input node 114 of the VCO 112, resulting in the voltage at the input node 114 being adjusted based on the feedforward signal from the feedforward circuit 110. With either of options 1 and 2, the feedforward circuit 110 is coupled directly to the PFD 104, and the feedforward signal is used to adjust the voltage provided to the VCO 112 such that phase error in the output signal 118 of the PLL circuit 102 is reduced.

In operation, the PFD 104 of the PLL circuit 102 is a detector configured to output an error signal to indicate a phase offset between the CLK signal and the REF_CLK signal. The charge pump 106 is coupled to the PFD 104 and is configured to output a charge pump signal based on the error signal. In some examples, the loop filter 108 includes an integrator with a feedback path, an input node (e.g., the first input node 109), a reference node (e.g., the second input node 111), and an output node, wherein the input node is coupled to the charge pump 106 and receives the charge pump signal. In some examples, the VCO 112 is coupled to the output node of the integrator via a resistor. Meanwhile, the feedforward circuit 110 is coupled directly to the PFD 104 and is configured to apply an averaged version of the error signal to correct a voltage level received by the VCO 112.

In some examples (as in option 1), the feedforward circuit 110 is coupled to the reference node (e.g., the feedforward node 115 is connected to the second input node 111) of the integrator and applies the averaged version of the error signal to the reference node to correct the voltage level received by the VCO 112. In such examples, a reference signal resistor (e.g., R_O1) is between a reference signal node (e.g., the second input node 111) and the feedforward node 115, where the feedforward circuit 110 applies the feedforward signal to the reference node of the integrator.

In other examples (as in option 2), the feedforward circuit 110 couples to a feedforward node 117 between a resistor (see e.g., FIGS. 2 and 3) at the output of the loop filter 108 and the VCO 112, where the feedforward circuit 110 applies the averaged version of the error signal to the feedforward node 117 to correct the voltage level received by the VCO 112. For either of options 1 and 2, in some examples, the feedback path of the integrator for the loop filter 108 only includes a capacitor. In other examples, the feedback path of the integrator for the loop filter 108 includes a capacitor and a feedback resistor.

Figure 2:
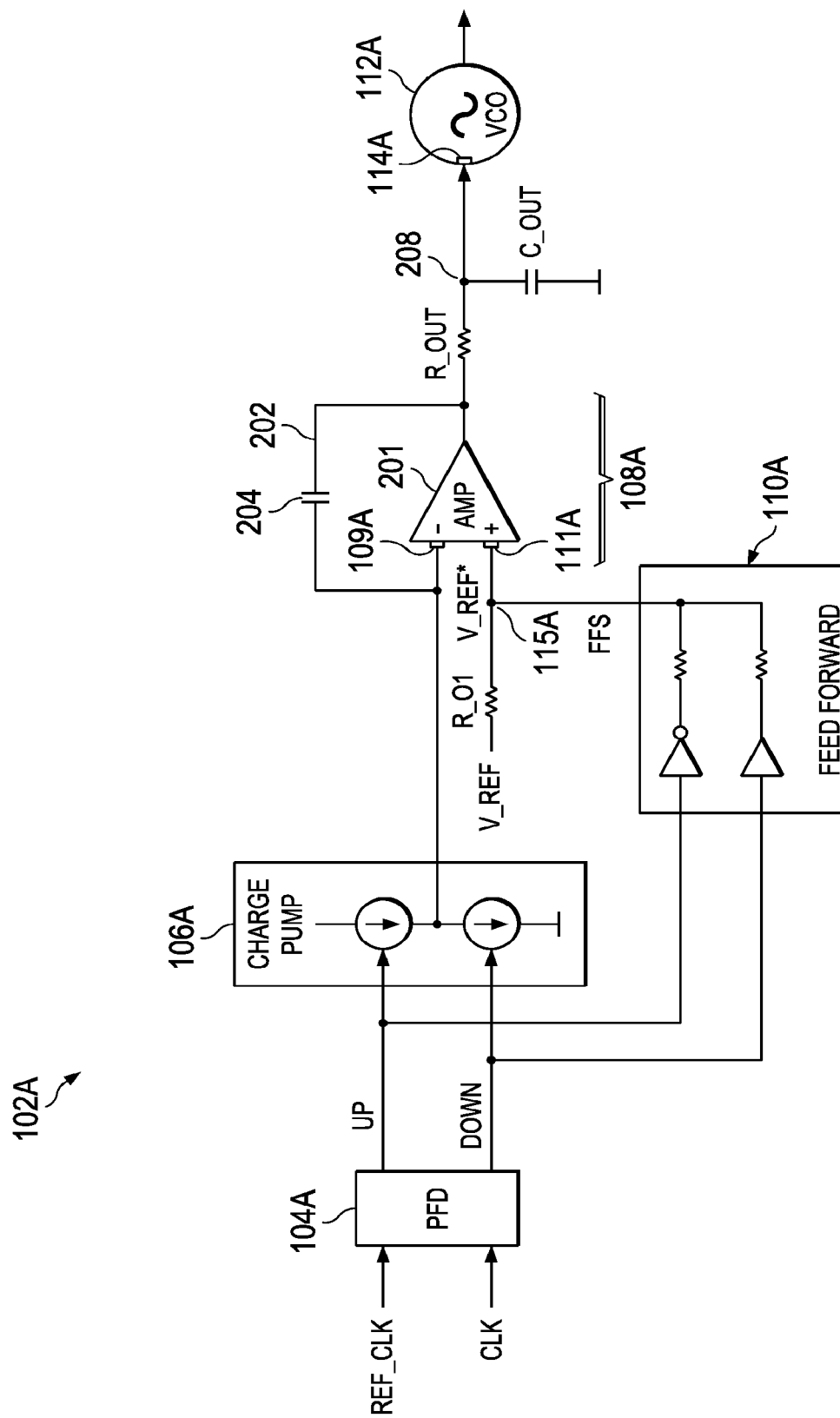
FIG. 2 is a schematic diagram illustrating a phase-locked loop (PLL) circuit in accordance with various examples.
Figure 3:
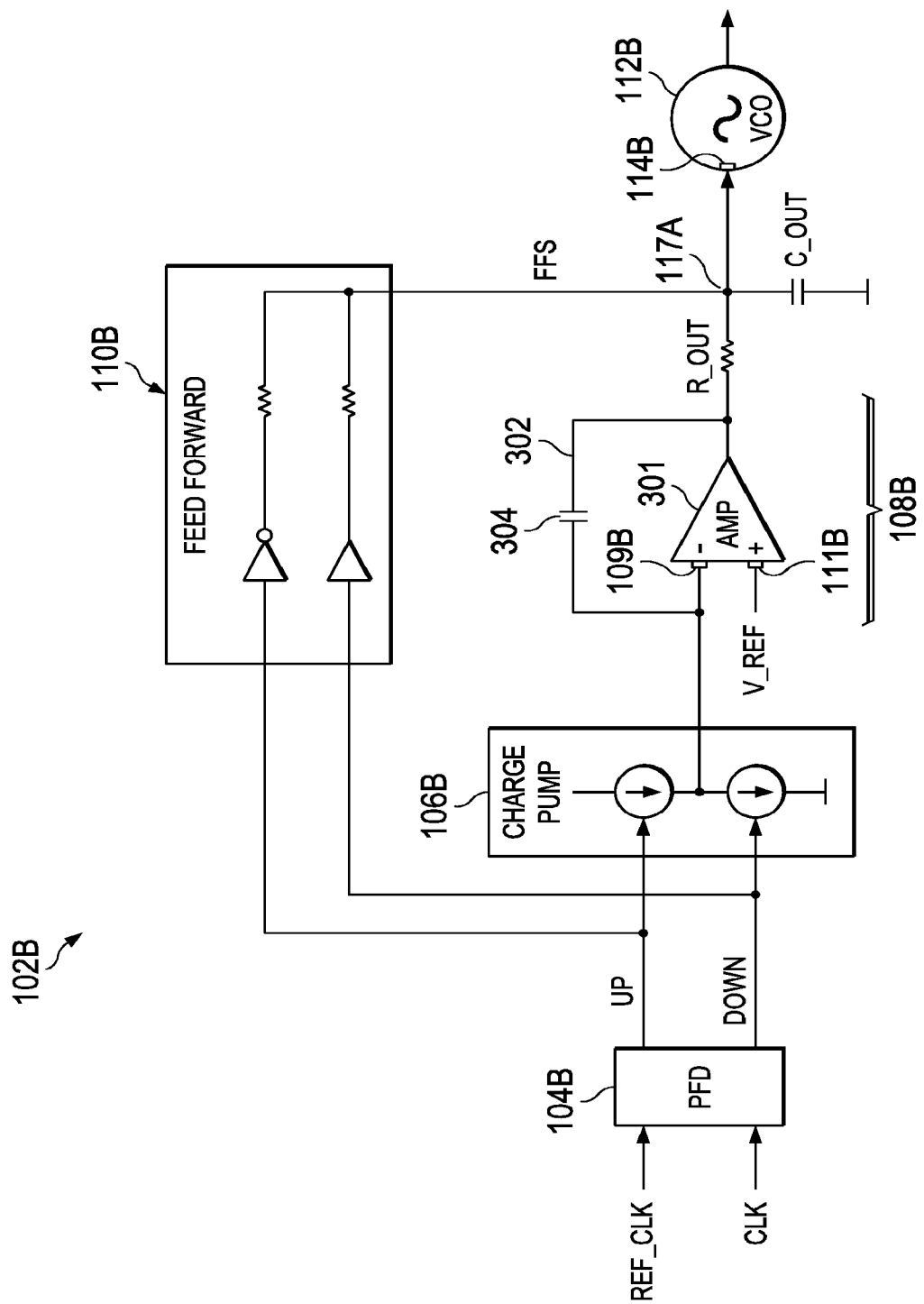
FIG. 3 is a schematic diagram illustrating another PLL circuit in accordance with various examples.
Figure 4:
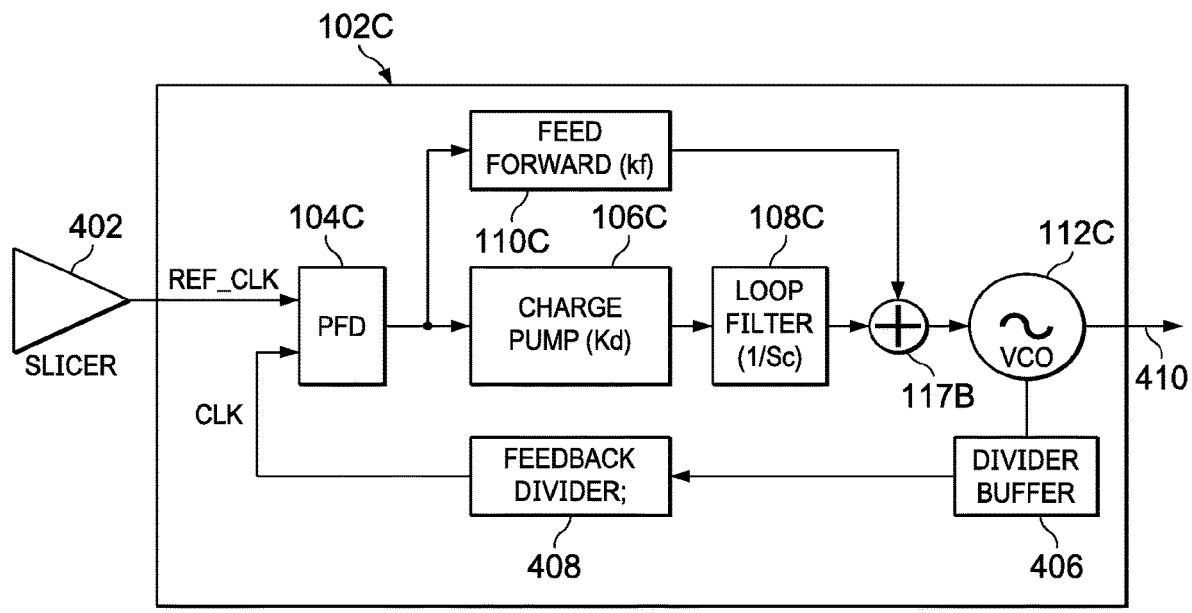
FIG. 4 is a block diagram illustrating a PLL circuit with modeled components in accordance with various examples.

In some examples, the PFD 104 comprises a first output node and a second output node (see e.g., FIG. 2-4). In such examples, the feedforward circuit 110 comprises a first path coupled to the first output node, and a second path coupled to the second output node. The first and second paths operate to average pulses (corresponding to the error signal) output from the first and second output nodes of the PFD 104. In one example, the first output node of the PFD 104 is configured to output UP signals to the first path, and the second output node of the detector is configured to output DOWN signals to the second path. In some examples, the first path of the feedforward circuit 110 comprises an inverter and a first resistor, and the second path of the feedforward circuit 110 comprises a buffer and a second resistor. Also, in some examples, the feedforward circuit 110 has a gain of $Vdd/(2*\pi)$, where Vdd is power supply voltage provided to the integrator.

FIG. 2 is a schematic diagram illustrating a PLL circuit 102A in accordance with various examples. In the example of FIG. 2, the PLL circuit 102A corresponds to the PLL circuit 102 of FIG. 1 with feedforward option 1. More specifically, the PLL circuit 102A comprises a PFD 104A coupled to a charge pump 106A, where the PFD 104A and the charge pump 106A of FIG. 2 are examples of the PFD 104 and the charge pump 106 of FIG. 1. As shown, the PFD 104A receives a reference clock signal (REF_CLK) and a feedback signal (CLK) as inputs. In some examples, the output of the PFD 104A is an UP signal when a phase of the CLK signal needs to be increased to align with the phase of the REF_CLK signal. On the other hand, in some examples, the output of the PFD 104A is a DOWN signal when a phase of the CLK signal needs to be decreased to align with the phase of the REF_CLK signal.

In the example of FIG. 2, the charge pump 106A receives UP and DOWN signals from the PFD 104A and adjusts a charge pump signal to the loop filter 108A accordingly. More specifically, the output of the charge pump 106A is input to the negative input node 109A (an example of the first input node 109 in FIG. 1) of the loop filter 108A. In FIG. 2, the loop filter 108A corresponds to an integrator formed using an operational amplifier 201 with a capacitor 204 in the feedback loop 202. Meanwhile, the feedforward circuit 110A (an example of the feedforward circuit 110 in FIG. 1) provides a feedforward signal (labeled "FFS" in FIG. 2) to the positive input node 111A (an example of the second input node 111 in FIG. 1) of the loop filter 108A. As represented in FIG. 2, the feedforward signal is combined with a V_REF* signal as the input to the positive input of the loop filter 108A, where the V_REF* signal is a function of a V_REF signal and R_O1 (the V_REF* signal is a derived version of the V_REF signal due to R_O1).

The output of the loop filter 108A is a function of the difference between the signals at the negative input node 109A and the positive input node 111A. In the example of FIG. 2, the output of the loop filter 108A is provided to an RC circuit having a resistor (R_OUT) and a capacitor (C_OUT). Between R_OUT and C_OUT is a node 208 that couples to an input node 114A of the VCO 112A. Accordingly, for the PLL circuit 102A, the voltage at the input node 114A of the VCO 112A is a function of the operations of the PFD 104A, the charge pump 106A, the feedforward circuit 110A (applying the feedforward signal to the input node 111A of the loop filter 108A), the loop filter 108A, and the RC circuit, where use of the feedforward circuit 110A reduces phase noise in the output signal for the PPL circuit 102A.

FIG. 3 is a schematic diagram illustrating another PLL circuit 102B in accordance with various examples. In the example of FIG. 3, the PLL circuit 102B corresponds to the PLL circuit 102 of FIG. 1 with feedforward option 2. More specifically, the PLL circuit 102B comprises a PFD 104B coupled to a charge pump 106B, where the PFD 104B and the charge pump 106B of FIG. 3 are examples of the PFD 104 and the charge pump 106 of FIG. 1. As shown, the PFD 104B receives a reference clock signal (REF_CLK) and a feedback signal (CLK) as inputs. In some examples, the output of the PFD 104B is an UP signal when a phase of the CLK signal needs to be increased to align with the phase of the REF_CLK signal. On the other hand, in some examples, the output of the PFD 104B is a DOWN signal when a phase of the CLK signal needs to be decreased to align with the phase of the REF_CLK signal.

In the example of FIG. 3, the charge pump 106B receives UP and DOWN signals from the PFD 104B and adjusts a current to the loop filter 108B up or down. More specifically, the output of the charge pump 106B is input to the negative input node 109B (an example of the first input node 109 in FIG. 1) of the loop filter 108B. Meanwhile, a reference voltage is input to the positive input node 111B (an example of the second input node 111 in FIG. 1) of the loop filter 108B. In FIG. 3, the loop filter 108B corresponds to an integrator formed using an operational amplifier 301 with a capacitor 304 in the feedback loop 302.

In FIG. 3, the output of the loop filter 108B is a function of the difference between the signals at the negative input node 109B and the positive input node 111B. As shown, the output of the loop filter 108B is provided to an RC circuit having a resistor (R_OUT) and a capacitor (C_OUT). Between R_OUT and C_OUT is a node 308 that couples to an input node 114B of the VCO 112B. In the example of FIG. 3, the node 308 receives the feedforward signal (labeled "FFS" in FIG. 3) from the feedforward circuit 110B. Accordingly, for the PLL circuit 102B, the voltage at the input node 114B of the VCO 112B is a function of the operations of the PFD 104B, the charge pump 106B, the loop filter 108B, the RC circuit, and the feedforward circuit 110B (applying the feedforward signal to node 308), where use of the feedforward circuit 110B reduces phase noise for the PPL circuit 102B.

FIG. 4 is a block diagram illustrating a PLL circuit 102C with modeled components in accordance with various examples. In the example of FIG. 4, the PLL circuit 102C corresponds to the PLL circuit 102A of FIG. 2, PLL circuit 102B of FIG. 3, or to the PLL circuit 102 of FIG. 1 with feedforward option 1 or 2. As shown, the PLL circuit 102C includes a PFD 104C, which is an example of the PFD 104B in FIG. 3, or the PFD 104 in FIG. 1. The inputs to the PFD 104C include a feedback signal (CLK) and a reference signal (REF_CLK). More specifically, in the example of FIG. 4, the REF_CLK signal is represented as being provided to the PFD 104C via a slicer 402. Meanwhile, the CLK signal is represented as being provided to the PFD 104C by passing the output of the VCO 112C (an example of the VCO 112B in FIG. 3, or the VCO 112 in FIG. 1) to a divider buffer 406 and a feedback divider 408, where the output of the feedback divider 408 is the CLK signal. In the example of FIG. 4, the PLL circuit 102C corresponds to the PLL circuit 1026 of FIG. 3, or to the PLL 102 of FIG. 1 with feedforward option 2.

In FIG. 4, the charge pump 106C receives the output of the PFD 104C, where the charge pump 106C is an example of the charge pump 106B of FIG. 3, or the charge pump 106 of FIG. 1. As represented in FIG. 4, the charge pump 106C applies a gain (Kd) to the signal from the PFD 104C. Thereafter, the loop filter 108C, which is an example of the loop filter 108B in FIG. 3, or the loop filter 108 in FIG. 1, applies a frequency dependent gain by integration (1/sC) to the output of the charge pump 106C. The output of the loop filter 108C is combined with the output of a feedforward circuit 110C, which is an example of the feedforward circuit 110B of FIG. 3, or the feedforward circuit 110 of FIG. 1. As represented in FIG. 4, the feedforward circuit 110C applies a gain (Kf) to the output of the PFD 104C. The output of the feedforward circuit 110C and the output of the loop filter 108C are combined at node 404, which is an example of the node 308 in FIG. 3, or the feedforward node 117 in FIG. 1. The output from the node 404 is provided to the VCO 112C, resulting in the VCO 112C outputting a signal with a phase that varies as a function of the signal at node 404. In FIG. 4, the output from the VCO 112C is provided to the divider buffer 406 as previously discussed, and is a local oscillator signal 410.

The control loop behavior of the PLL circuit 102C can be represented using various parameters. More specifically, in some examples, the phase of the output of the VCO 112C as a function of the phase error between a feedback signal (e.g., CLK) and a reference signal (e.g., REF_CLK) is given as:

$$\frac{\phi_{OUT}}{\phi_e} = \frac{K_d(1+sCR)K_v}{sC \cdot s} = \frac{K(1+sCR)}{s^2}, \quad \text{Equation (1)}$$

where $R=K_f/K_d$, where $\phi_{OUT}$ is the phase of the output of the VCO 112C, $\phi_e$ is the phase error between the CLK signal and the CLK REF signal, Kd is the gain applied by the charge pump 106C, s is a frequency of the control loop, C is a capacitance of the control loop, R is a resistance of the control loop, and Kv is the gain expressed as a change in VCO output frequency caused by a change in the control voltage at its input. In addition, in some examples, the output voltage ($V_c$) of the VCO 112C as a function of $\phi_e$ is given as:

$$\frac{V_c}{\phi_e} = \frac{K_d(1+sCR)}{sC} = \frac{K_d}{sC} + K_d R = \frac{K_d}{sC} + K_f, \quad \text{Equation (2)}$$

where Kd is the gain applied by the charge pump 106C, s is a frequency of the control loop, C is the capacitance of the control loop, R is the resistance of the control loop, and $K_f$ is a gain applied by the feedforward circuit 110C. Also, in some examples, a zero for the control loop is determined from other values. For example, in some examples, a zero the control loop is determined as:

$$Zero = \frac{1}{RC} = \frac{K_d/K_f}{C} \quad \text{Equation (3)}$$

Also, in some examples, a bandwidth for the control loop is estimated from other values. For example, in some examples, a bandwidth (BW) the control loop is estimated as:

$$BW \propto K_d \cdot R \cdot K_v \propto K_f K_v. \quad \text{Equation (4)}$$

Figure 5:
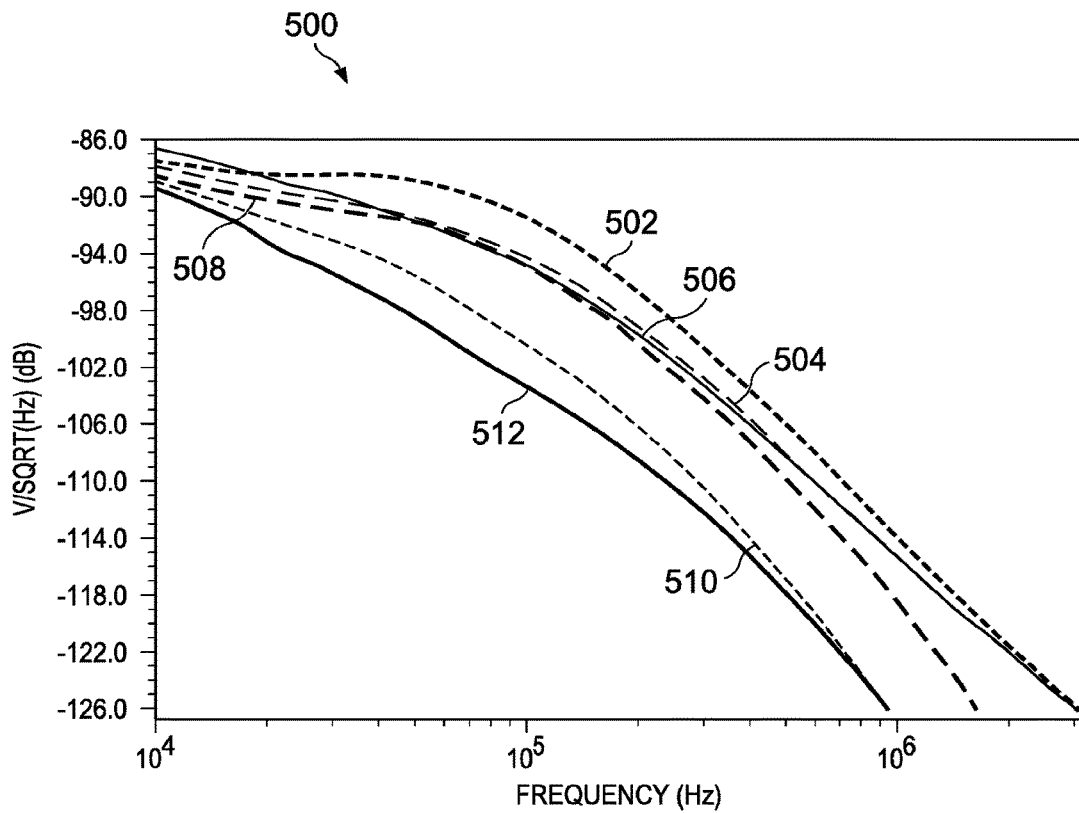
FIG. 5 is a graph illustrating phase noise as a function of frequency for various PLL circuits in accordance with various examples.

FIG. 5 is a graph 500 illustrating phase noise (in dB) as a function of frequency for various PLL circuits in accordance with various examples. In graph 500, various phase noise curves 502, 504, 506, 508, and 510 are represented. More specifically, noise curve 502 corresponds to a prior art PLL circuit, phase noise curve 504 corresponds to the PLL circuit 102A of FIG. 2, phase noise curve 506 corresponds to the PLL circuit 102B of FIG. 3, phase noise curve 508 corresponds to a prior art PLL circuit with a noiseless VCO, phase noise curve 510 corresponds to the PLL circuit 102A of FIG. 2 with a noiseless VCO, and phase noise curve 512 corresponds to the PLL circuit 102B of FIG. 3 with a noiseless VCO. As shown in graph 500, use of a feedforward circuit as described herein lowers the phase noise compared to a prior art PLL circuit (which uses an actual resistance R in its feedback path in series with capacitor C).

Figure 6:
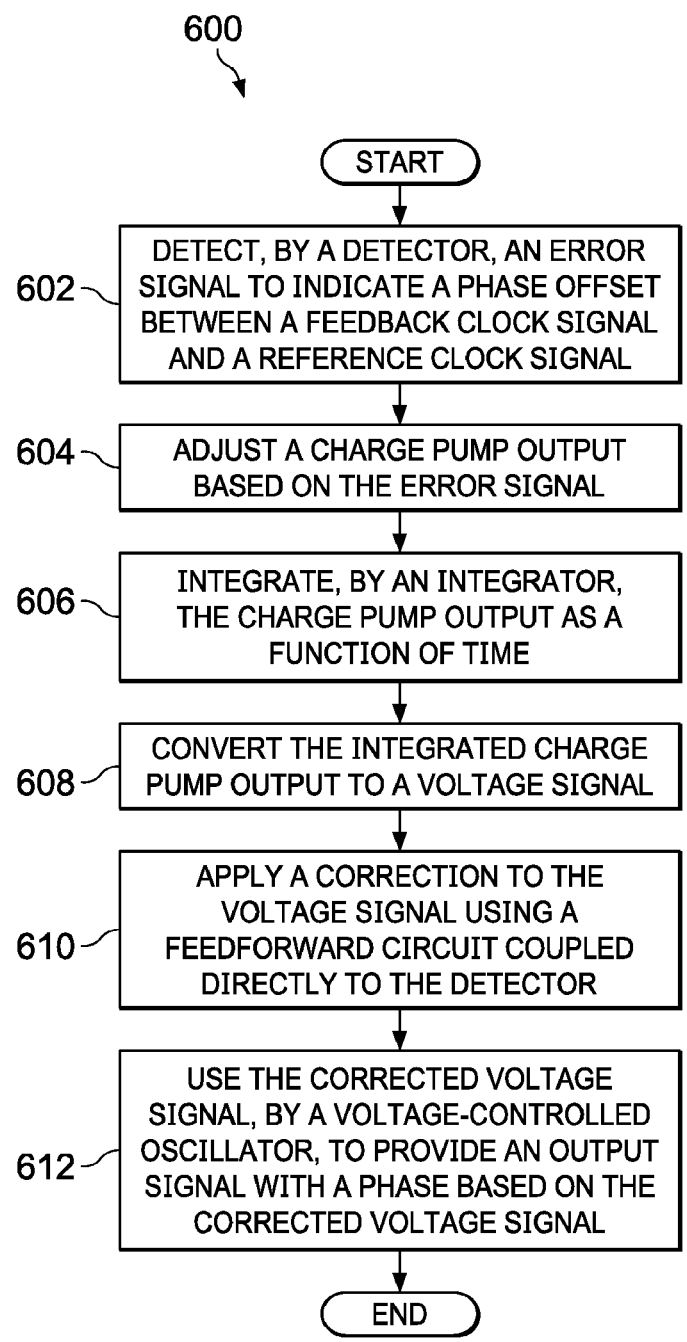
FIG. 6 is a flowchart illustrating a PLL method in accordance with various examples.

FIG. 6 is a flowchart illustrating a PLL method 600 in accordance with various examples. As shown, the method 600 comprises detecting, by a detector, an error signal to indicate a phase offset between a feedback clock signal (CLK) and a reference clock signal (REF_CLK) at block 602. At block 604, a charge pump output is adjusted based on the error signal. At block 606, the charge pump output is integrated, by an integrator as a function of time. At block 608, the integrated charge pump output is converted to a voltage signal. At block 610, a correction is applied to the voltage signal using a feedforward circuit coupled directly to the detector. In some examples, the operations of block 610 involve using the feedforward circuit to apply a correction to a reference node of the integrator. In other examples, the operations of block 610 involve using the feedforward circuit to apply a correction to an input node of the VCO. At block 612, the corrected voltage signal is used by a VCO (e.g., VCO 112C in FIG. 4, VCO 112B in FIG. 3, VCO 112A in FIG. 2, VCO 112 in FIG. 1) to provide an output signal with a phase based on the corrected voltage signal.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device comprising:
    a phase offset detector having a first input, a second input, and an output, wherein the first input is configured to receive a first clock signal and the second input is configured to receive a second clock signal;
    a charge pump having an input and an output, wherein the input of the charge pump is coupled to the output of the phase offset detector;
    a feedforward circuit having an input and an output, wherein the input of the feedforward circuit is coupled to the output of the phase offset detector;
    an integrator having a first input, a second input and an output, wherein the first input of the integrator is coupled to the output of the charge pump and the second input of the integrator is coupled to a reference voltage terminal; and
    a controllable oscillator having an input coupled to the output of the integrator.

2. The device of claim 1, wherein the second input of the integrator is a reference node of the integrator.

3. The device of claim 2, further comprising a voltage generator having an output that is coupled to the second input of the integrator.

4. The device of claim 1, further comprising a capacitor with a first terminal coupled to the output of the integrator and a second terminal coupled to the first input of the integrator.

5. The device of claim 1, wherein the output of the phase offset detector is a first output of the phase offset detector, wherein the phase offset detector has a second output, and wherein the feedforward circuit has a second input, the second input of the feedforward circuit is coupled to the second output of the phase offset detector.

6. The device of claim 1, further comprising an inverter having an input and an output, wherein the input of the inverter is coupled to the output of the phase offset detector and the output of the inverter is coupled to the second input of the integrator.

7. The device of claim 5, wherein the phase offset detector is configured to output a first signal at the first output of the phase offset detector based on the first and second clock signals, and output a second signal at the second output of the phase offset detector based on the first and second clock signals.

8. An apparatus comprising:
   a first clock signal generator;
   a second clock signal generator; and
   a phase-locked loop (PLL) including:
      a phase offset detector having a first input, a second input, and an output, wherein the first input is coupled to the first clock signal generator and the second input is coupled to the second clock signal generator;
      a charge pump having an input and an output, wherein the input of the charge pump is coupled to the output of the phase offset detector;
      a feedforward circuit having an input and an output, wherein the input of the feedforward circuit is coupled to the output of the phase offset detector;
      an integrator having a first input, a second input and an output, wherein the first input of the integrator is coupled to the output of the charge pump and the second input of the integrator is coupled to a reference terminal; and
      a controllable oscillator having an input coupled to the output of the integrator.

9. The apparatus of claim 8, wherein the second input of the integrator is a reference node of the integrator.

10. The apparatus of claim 9, wherein the PLL further comprises a voltage generator having an output that is coupled to the second input of the integrator.

11. The apparatus of claim 8, wherein the PLL further comprises a capacitor with a first terminal coupled to the output of the integrator and a second terminal coupled to the first input of the integrator.

12. The apparatus of claim 8, wherein the feedforward circuit has a second input and the phase offset detector has a second output, the second input of the feedforward circuit is coupled to the second output of the phase offset detector.

13. The device of claim 1, wherein the controllable oscillator is a voltage-controlled oscillator.

14. The device of claim 1, wherein the output of the feedforward circuit is coupled to the second input of the integrator.

15. The device of claim 1, wherein the output of the feedforward circuit is coupled to the output of the integrator.

16. The device of claim 1, wherein the reference voltage terminal is coupled to the second input of the integrator via a resistor.

17. The device of claim 4, wherein the first terminal of the capacitor is directly connected to the output of the integrator, and the second terminal of the capacitor is directly connected to the first input of the integrator.

18. The device of claim 1, further comprising:
   an inverter having an input coupled to the output of the phase offset detector, and an output; and
   a buffer having an input coupled to a second output of the phase offset detector, and an output coupled to the output of the inverter.

19. The device of claim 18, wherein the output of the inverter is coupled to the second input of the integrator via a first resistor, and the output of the buffer is coupled to the second input of the integrator via a second resistor.

20. The device of claim 18, wherein the output of the inverter is coupled to the output of the integrator via a first resistor, and the output of the buffer is coupled to the output of the integrator via a second resistor.

* * * * *